United States Patent
Scholes et al.

(10) Patent No.: US 9,488,335 B2
(45) Date of Patent: Nov. 8, 2016

(54) ELECTROMAGNETIC RADIATION SHIELDING ASSEMBLY

(71) Applicant: The Boeing Company, Chicago, IL (US)

(72) Inventors: Dallas S. Scholes, Buckley, WA (US); Eric P. Oman, Saint Louis, MO (US); Jason D. Habedank, St. Peters, MO (US); David J. Meyer, Lake St. Louis, MO (US)

(73) Assignee: The Boeing Company, Chicago, IL (US)

( * ) Notice: Subject to any disclaimer, the term of this patent is extended or adjusted under 35 U.S.C. 154(b) by 707 days.

(21) Appl. No.: 13/861,290

(22) Filed: Apr. 11, 2013

(65) Prior Publication Data

US 2016/0047532 A1    Feb. 18, 2016

(51) Int. Cl.
| | |
|---|---|
| *H05K 9/00* | (2006.01) |
| *G02B 5/20* | (2006.01) |
| *F21V 9/16* | (2006.01) |
| *G02B 5/22* | (2006.01) |

(52) U.S. Cl.
CPC ............... *F21V 9/16* (2013.01); *G02B 5/208* (2013.01); *G02B 5/223* (2013.01); *H05K 9/0094* (2013.01)

(58) Field of Classification Search
CPC ........................................................ F21V 9/16
See application file for complete search history.

(56) References Cited

U.S. PATENT DOCUMENTS

| | | | |
|---|---|---|---|
| 4,978,182 A | 12/1990 | Tedesco | |
| 6,243,219 B1 | 6/2001 | Hutcheson et al. | |
| 6,986,581 B2 | 1/2006 | Sun et al. | |
| 7,090,355 B2 | 8/2006 | Liu et al. | |
| 8,486,311 B1 | 7/2013 | Takiff et al. | |
| 8,786,689 B1* | 7/2014 | Liu .................... | A61B 1/00034 348/68 |
| 8,950,684 B1* | 2/2015 | Scholes .............. | G06K 19/0614 235/491 |
| 2004/0232826 A1 | 11/2004 | Liu et al. | |
| 2010/0253601 A1 | 10/2010 | Seder et al. | |
| 2012/0287522 A1* | 11/2012 | Ofir ......................... | G02B 5/23 359/890 |

FOREIGN PATENT DOCUMENTS

| | | |
|---|---|---|
| DE | 40 26 728 A1 | 2/1992 |
| DE | 301 133 A7 | 10/1992 |

(Continued)

OTHER PUBLICATIONS

Official Action, Canadian Intellectual Property Office, CA 2,843,654 (Aug. 26, 2015).

(Continued)

*Primary Examiner* — Casey Bryant
(74) *Attorney, Agent, or Firm* — Walters & Wasylyna LLC

(57) ABSTRACT

An electromagnetic shielding assembly may include a transparent substrate layer and a transparent active layer positioned with respect to the substrate, wherein the active layer is configured to absorb electromagnetic radiation having a first wavelength and emit electromagnetic radiation having a second wavelength, the second wavelength being different than the first wavelength, the active layer includes fluorescent molecules combined with a base material, the fluorescent molecules being configured to absorb electromagnetic radiation having the first wavelength and emit the electromagnetic radiation having the second wavelength, wherein the first wavelength is in a visible electromagnetic spectrum and the second wavelength is in a non-visible electromagnetic spectrum.

20 Claims, 6 Drawing Sheets

(56) References Cited

FOREIGN PATENT DOCUMENTS

| EP | 2 463 196 | 6/2012 |
|---|---|---|
| FR | 2 723 532 | 2/1996 |
| WO | WO2009/100195 | 8/2009 |

OTHER PUBLICATIONS

"Laser Strikes on Aircraft on Record Pace," ABC News (2013).
Elias, "Lasers Aimed at Aircraft Cockpits: Background and Possible Options to Address the Threat to Aviation Safety and Security," CRS Report for Congress (2005).
"IR Inks," www.maxmax.com/airinks.html (2013).
Reichman, "Handbook of Optical Filters for Fluoroscience Microscopy," Chroma Technology Corp. (2000).
LaHood, "Laser Incidents Reach Record Numbers in 2010 Skies," The Official Blog of Ray LaHood, the U.S. Secretary of Transportation (2011).
Service, "Fluorescent Proteins Go Invisible," ScienceNOW (2009).
"Lasers an Increasing Hazard for Pilots," Washington Post Editors (2011).
European Patent Office, Extended European Search Report, EP 14 160 945.3 (Mar. 24, 2016).
Canadian Intellectual Property Office, Official Action, CA 2,843,654 (Aug. 25, 2016).

* cited by examiner

ELECTROMAGNETIC RADIATION SHIELDING ASSEMBLY

FIELD

The present disclosure is generally related to filtering electromagnetic radiation and, more particularly, to an electromagnetic shielding assembly configured to absorb light having a first wavelength and to emit light having a second wavelength.

BACKGROUND

Laser beam generating devices are commercially available as laser pointers and other devices that generate a focused, high power laser beam. Commercial laser pointers are readily available to the public and are being used to interfere with pilots while in critical phases of flight operations. The laser beam generated by such devices can be directed at aircraft and reach the cockpit of such aircraft. When the laser beam interacts with the cockpit glass, the laser beam can bloom or glare on the glass and/or travel to the pilot's eyes, thus interfering with the pilot's vision. Unfortunately, the number of such laser beam incidents has nearly doubled in recent years.

Pilots must not only see outside of the aircraft, but they also must see their instruments without any hindrances. When a laser is pointed at an aircraft, such an incident takes a pilot's attention away from the business of getting passengers safely to their destination. Laser pointers can have a dramatic effect on a pilot's vision, especially during critical phases of flight, such as takeoff and landing. Laser strikes can also harm a pilot's vision. For example, when a pilot has been piloting an aircraft in nighttime conditions, a sudden, brilliant green beam of light directly in the eyes can result in persistent pain, eye spasms and spots in the pilot's vision.

While pilots are instructed to look away from a laser beam or close an eye to avoid the laser beam, by the time the pilot looks away or closes an eye, the laser beam has already reached the pilot's eyes. Furthermore, averting the eyes effectively diminishes the pilot's ability to control the airplane.

Specialized sunglasses can reduce the impact of a laser beam on the pilot's eyes, but these devices also restrict the pilot's ability to see the cockpit instruments. Other types of sunglasses inhibit a broad range of wavelengths of light from reaching the pilot's eyes, which can be undesirable at night and other low light conditions and can be dislodged during adverse weather or turbulence only to cause additional distraction. Additionally, sunglasses can also be costly when they are in prescriptive form, can cause glare, and are subject to dust and oil buildup.

Tinted windows suffer from similar drawbacks by inhibiting all wavelengths of light from reaching the pilot's eyes. Auto-dimming glasses or windows gradually dim and may not block the laser beam before the pilot's vision has already been impaired. Additionally, some auto-dimming glass requires a power source.

Existing technologies provide glasses having applied coatings to block intense light. However, these types of glasses restrict all wavelengths of light, thereby dimming the appearance of critical flight instruments and the external view outside of the cockpit.

Similar problems exist for automobile drivers in sunny conditions or when an on-coming car has bright headlight beams.

Accordingly, those skilled in the art continue with research and development efforts in the field of shielding optics, such as human vision, from light interference.

SUMMARY

In one embodiment, the disclosed electromagnetic radiation shielding assembly may include a transparent substrate layer and a transparent active layer positioned with respect to the substrate, wherein the active layer is configured to absorb electromagnetic radiation having a first wavelength and emit electromagnetic radiation having a second wavelength, the second wavelength being different than the first wavelength.

In another embodiment, the disclosed electromagnetic shielding assembly may include a transparent substrate layer and a transparent active layer positioned with respect to the substrate, wherein the active layer is configured to absorb electromagnetic radiation having a first wavelength and emit electromagnetic radiation having a second wavelength, the second wavelength being different than the first wavelength, the active layer includes fluorescent molecules combined with a base material, the fluorescent molecules being configured to absorb electromagnetic radiation having the first wavelength and emit the electromagnetic radiation having the second wavelength, wherein the first wavelength is in a visible electromagnetic spectrum and the second wavelength is in a non-visible electromagnetic spectrum.

In another embodiment, the disclosed electromagnetic shielding assembly may include an active layer including a transparent base material and a plurality of fluorescent molecules combined with the base material, wherein the fluorescent molecules are configured to absorb electromagnetic radiation having a first wavelength and emit electromagnetic radiation having a second wavelength, the second wavelength being different than said first wavelength.

In yet another embodiment, disclosed is a method for making an electromagnetic radiation shielding assembly configured to absorb light having a first wavelength and to emit light having a second wavelength, the method may include the steps of: (1) designing a fluorescent molecule having excitation and emission characteristics in response to electromagnetic radiation having a predetermined wavelength, (2) providing a base material configured to receive a plurality of fluorescent molecules, (3) combining the plurality of fluorescent molecules with the base material to form a fluorescent composition, (4) forming the fluorescent composition into a transparent active layer, (5) providing a transparent substrate layer, and (6) applying the active layer to the substrate layer.

Other embodiments of the disclosed electromagnetic radiation shielding assembly will become apparent from the following detailed description, the accompanying drawings and the appended claims.

DETAILED DESCRIPTION

Figure 1:
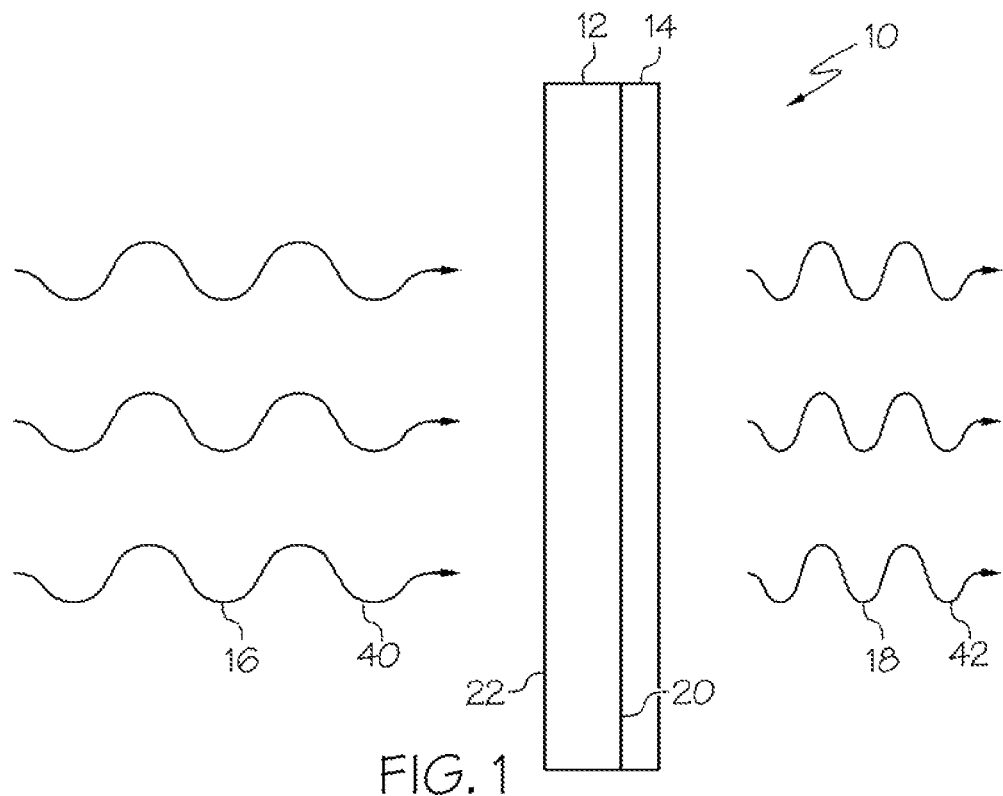
FIG. 1 is a cross-sectional view of one embodiment of the disclosed electromagnetic radiation shielding assembly.

The following detailed description refers to the accompanying drawings, which illustrate specific embodiments of the disclosure. Other embodiments having different structures and operations do not depart from the scope of the present disclosure. Like reference numerals may refer to the same element or component in the different drawings.

Referring to FIG. 1, one embodiment of the disclosed shielding assembly, generally designated 10, may include a substrate layer 12 and an active layer 14 positioned with respect to the substrate layer 12. The active layer 14 may be configured to absorb electromagnetic radiation (e.g., absorbed electromagnetic radiation 16) having a first wavelength 40 and emit electromagnetic radiation (e.g., emitted electromagnetic radiation 18) having a second wavelength 42. The second wavelength 42 of the emitted electromagnetic radiation 18 may be different (e.g., longer or shorter) than the first wavelength 40 of the absorbed electromagnetic radiation 16. Therefore, the active layer 14 may absorb electromagnetic radiation 16 at a specific frequency or range of frequencies and emit electromagnetic radiation 18 at a different frequency or range of frequencies.

The substrate layer 12 may include any transparent or substantially transparent base material. In one implementation, the substrate layer 12 may be a panel of rigid material. For example, the substrate layer 12 may be made of glass, acrylic, thermoplastic, poly(methyl methacrylate), and the like. Specific non-limiting examples of the substrate layer 12 may include Plexiglass® by Arkema France, Lucite® by Lucite International, Inc., Perspex® by Imperial Chemical Industries Limited, and Acrysteel® by Aristech Acrylics, LLC. In another implementation, the substrate layer 12 may be a sheet of thin, flexible material. For example, the substrate layer 12 may be made of a thermoplastic, such as polyvinyl chloride, polyethylene, and the like.

Figure 2:
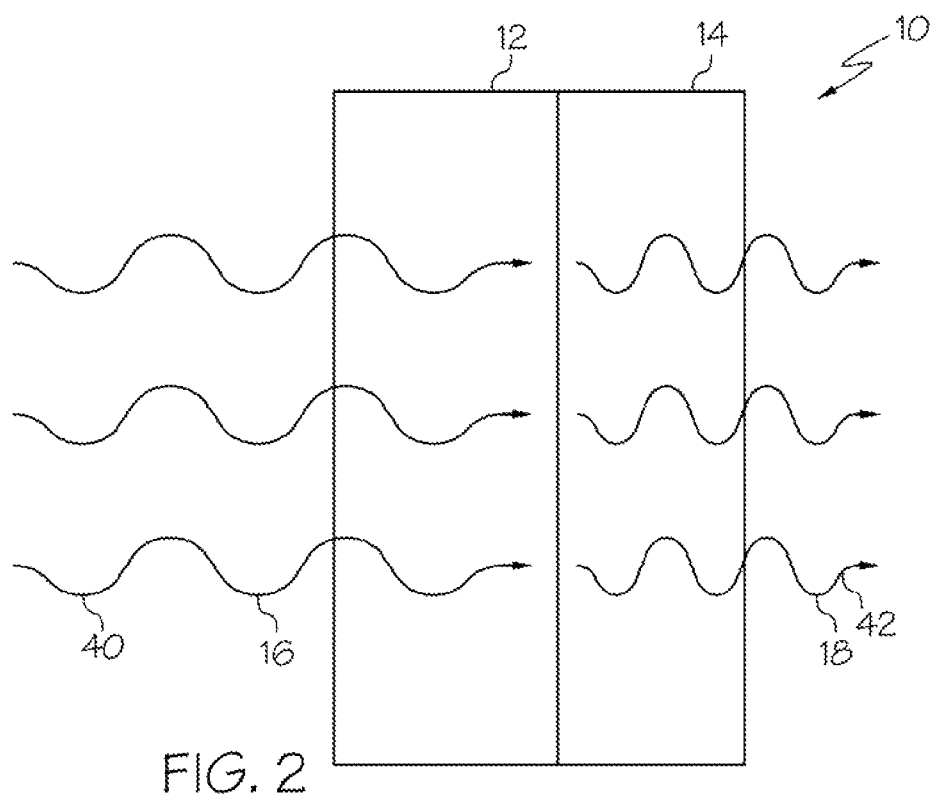
FIG. 2 is a schematic view of the disclosed electromagnetic radiation shielding assembly of FIG. 1.

As shown in FIG. 2, the absorbed electromagnetic radiation 16 may be visible light and the first wavelength 40 may be in the visible spectrum. The active layer 14 may shift the wavelength of visible light toward the non-visible spectrum (e.g., the second wavelength 42). For example, incoming visible light (e.g., absorbed electromagnetic radiation 16) having a wavelength in the visible spectrum (e.g., the first wavelength 40) may undergo a wavelength shift and may be emitted as light (e.g., emitted electromagnetic radiation 18) having a shifted wavelength (e.g., the second wavelength 40) as it passes through and is absorbed by the active layer 14.

Figure 3:
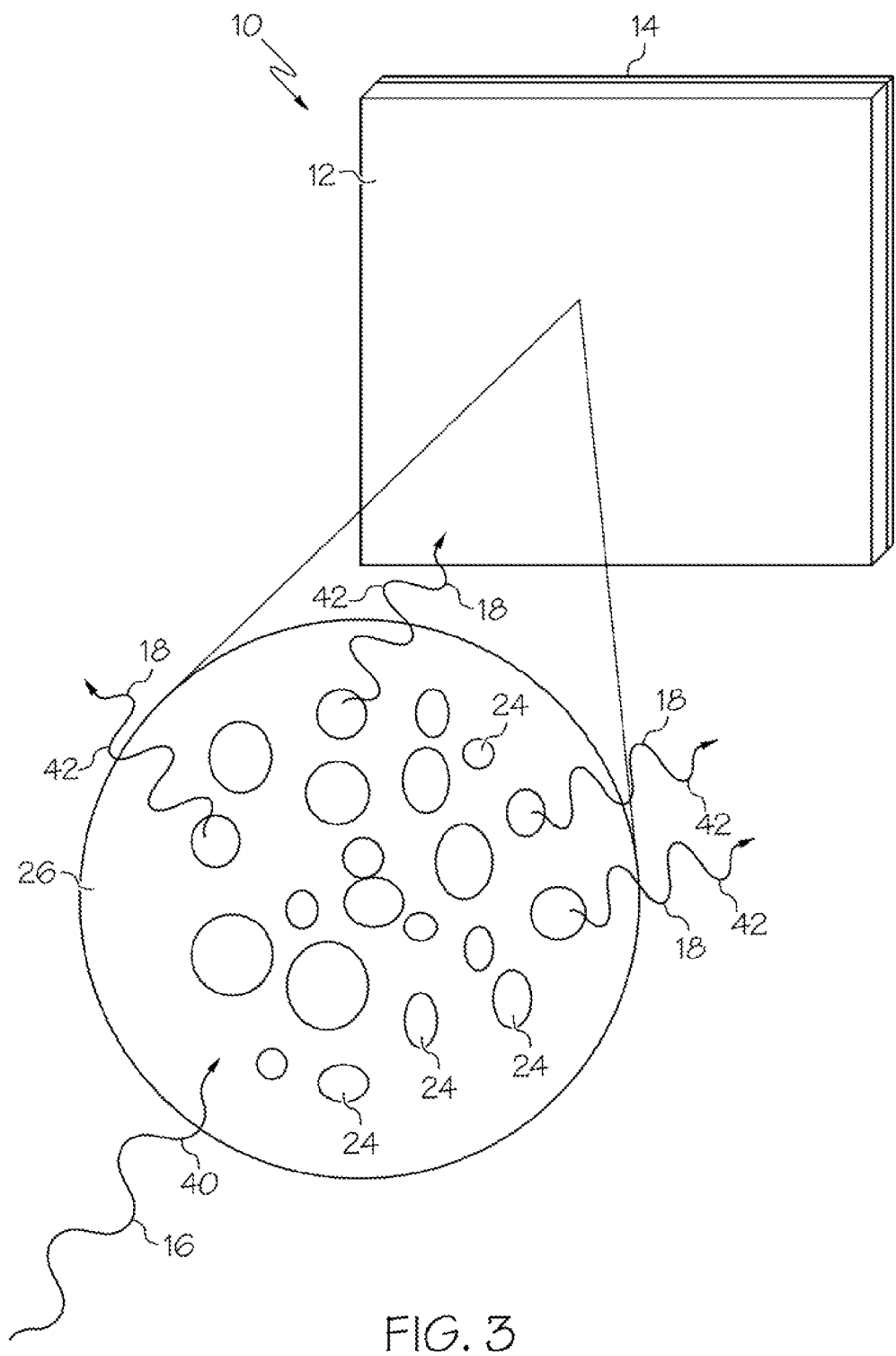
FIG. 3 is an enlarged view of the electromagnetic radiation shielding assembly illustrating the fluorescent molecules.

Referring to FIG. 3, the active layer 14 may include a fluorescent material or composition configured to absorb electromagnetic radiation (e.g., absorbed electromagnetic radiation 16) having a wavelength in the visible spectrum (e.g., the first wavelength 40) (referred to throughout as visible light or absorbed light) and to emit electromagnetic radiation (e.g., emitted electromagnetic radiation 18) having a wavelength in the non-visible or barely visible spectrum (e.g., the second wavelength 42) (referred to throughout as non-visible light or emitted light). The fluorescent material may include florescent molecules, or particles, 24 having pre-selected characteristics configured to react to or absorb visible light and emit non-visible light (e.g., infrared light or ultraviolet light). The florescent molecules 24 of the active layer 14 may be encased or encapsulated within a base material 26 for application to or upon the substrate layer 12. As such, the active layer 14 may be embodied as a transparent sheet having the molecule 24 therein.

Thus, in the illustrative embodiments, the fluorescent material (base material 26 and fluorescent molecules 24) of the active layer 14 may be any material configured to emit non-visible light in response to receiving visible light. Various types of fluorescent material may be utilized for the active layer 14. The size of any fluorescent particles may be very small, for example, nano-particles or molecules with sizes between about 0.5 nm to about 500 nm. The fluorescent molecules 24 may be any suitable type of molecular composition, including inorganic molecules, inorganic phosphors, organophosphate, organic molecules, dyes, semiconductor based nano-particles, organometallic molecules, organic-chlorophyll, or other suitable organic or inorganic materials.

Generally, fluorescence is a molecular phenomenon in which a substance absorbs visible light of one color (at a first wavelength) and almost instantaneously radiates, or emits, visible light of another color (at a different wavelength). This process is known as excitation and emission. Most fluorochromes may have well-defined bands of excitation and emission. The spectral distribution of emitted light may be largely independent of the excitation wavelength. The fluorescent molecules 24 of the active layer 14 may be tuned to absorb light having a range of wavelengths in the visible spectrum and emit light having a wavelength in the non-visible spectrum, which is invisible to the naked eye. The active layer 14 may capture, store, and transform energy from electromagnetic radiation and emit energy either through electrical connectors or through direct emission of electromagnetic radiation. Once the electromagnetic radiation is removed, the fluorescent material of the active layer 14 may return to an unexcited state capable of being excited again to dissipate energy without blocking or interfering with optics or vision.

In one particular embodiment, the molecule 24 may be an organic molecule having a design, or configuration, receptive to various ranges of or some portion of wavelengths similar to a molecular dye, such as a styryl dye. Generally, styryl dyes are organic molecules with fluorescent properties. Their fluorescent properties may depend on insertion of a hydrocarbon tail into a medium. The length of the hydrocarbon tail may determine the dissociation constant for insertion. For example, short tails (e.g., 43 C) may have a high dissociation constant and move fast, while longer tails may have a lower dissociation constant.

For example, styryl dyes, such as FM1-43 and FM4-64 molecules by Life Technologies, may be excited by wavelengths ranging between about 430 nm to about 520 nm (e.g., blue/green light). The emission spectrum may be shifted to a maximum wavelength of about 580 nm (e.g., yellow/orange light) for FM1-43. The emission spectrum may be shifted to a maximum wavelength of about 730 nm (e.g., far-red light) for FM4-64.

FM1-43 is a styrylpyridinium molecule, more concisely known as a styryl molecule or styryl dye. FM1-43 is an ampiphillic molecule, which has both a hydrophilic and a hydrophobic region. FM1-43 has a lipophilic tail made up of 2 hydrocarbon chains (e.g., CH3CH2CH2CH2 . . . ) and a positively charged ammonium head. The head may be a pyridinium group and it is made up of two aromatic rings with a double bond bridge in between them, known as the fluorophore part of the dye molecule. The fluorophore group has excitation at about 500 nm and emission of light at about 625 nm. The lipophilicity of the tail may provide the ability of the molecule dye to dissolve in fats, oils, lipids, and non-polar solvents such as hexane or toluene. The tail of the molecule is what allows the dye to get into the medium because the positively charged head cannot get into the medium. The interaction of the hydrocarbon tail is what causes the change in wavelength.

In another example, the fluorescent molecules 24 may be a type of frequency overlapping molecules providing Frequency Resonance Energy Transfer (FRET). FRET is a distance-dependent interaction between the electronic excited states of two dye molecules in which excitation is transferred from a donor molecule to an acceptor molecule without emission of a photon. The efficiency of FRET is dependent on the inverse sixth power of the intermolecular separation, making it useful over distances comparable to the dimensions of biological macromolecules.

Referring again to FIG. 1, the substrate layer 12 may include a first major surface 20 and an opposing second major surface 22. The active layer 14 may be integrated with or positioned adjacent to at least the first major surface 20 of the substrate layer 12 to form the shielding assembly 10.

The active layer 14 may include any transparent or substantially transparent base material (a carrier or matrix) 26. The fluorescent material or composition (e.g., the fluorescent molecules 24) may be added, mixed, bonded, or otherwise combined to the base material 26. Thus, the molecules 24 may be encapsulated (e.g., sealed) within the base material 26. Encapsulation within the base material 26 may provide an airtight environment for the fluorescent molecules 24, keeping the molecules 24 from the atmosphere to prevent degradation of the molecules 24. For example, the base material 26 may be a thermoplastic material that forms a solid body when cured. As another example, the base material 26 may be a binder, or vehicle, that is in liquid form to adhere to a substrate surface and dry as a solid film.

In one implementation, the active layer 14 may be a flexible sheet configured to overlay or be positioned adjacent to the substrate layer 12. In another implementation, the active layer 14 may be a rigid sheet configured to overlay or be positioned adjacent to the substrate layer 12. In another implementation, the active layer 14 may be a thin, flexible, solid film configured to overlay or be positioned adjacent to the substrate layer 12. In yet another implementation, the active layer 14 may be a liquefied material configured to coat and adhere to the substrate layer 12 and dry as a solid film.

Additional other substrates or coatings may compliment the substrate layer 12 and/or the active layer 14 to provide for tinting, substrate protection, light filtering (e.g., filtering external ultraviolet light) or other functions.

Another embodiment of the disclosed shielding assembly 10 may include one or more active layers 14 and no substrate layer 12. The active layer 14 may include fluorescent molecules 24 added to the base material 26. The base material 26 may be cured or set to form a durable, solid active layer 14. For example, the fluorescent molecules 24 may be combined with a substantially transparent thermoplastic or thermosetting polymer base material 26. As such, the active layer 14, or a plurality of active layers 14, alone may be utilized as the shielding assembly 10 in certain applications.

Figure 4:
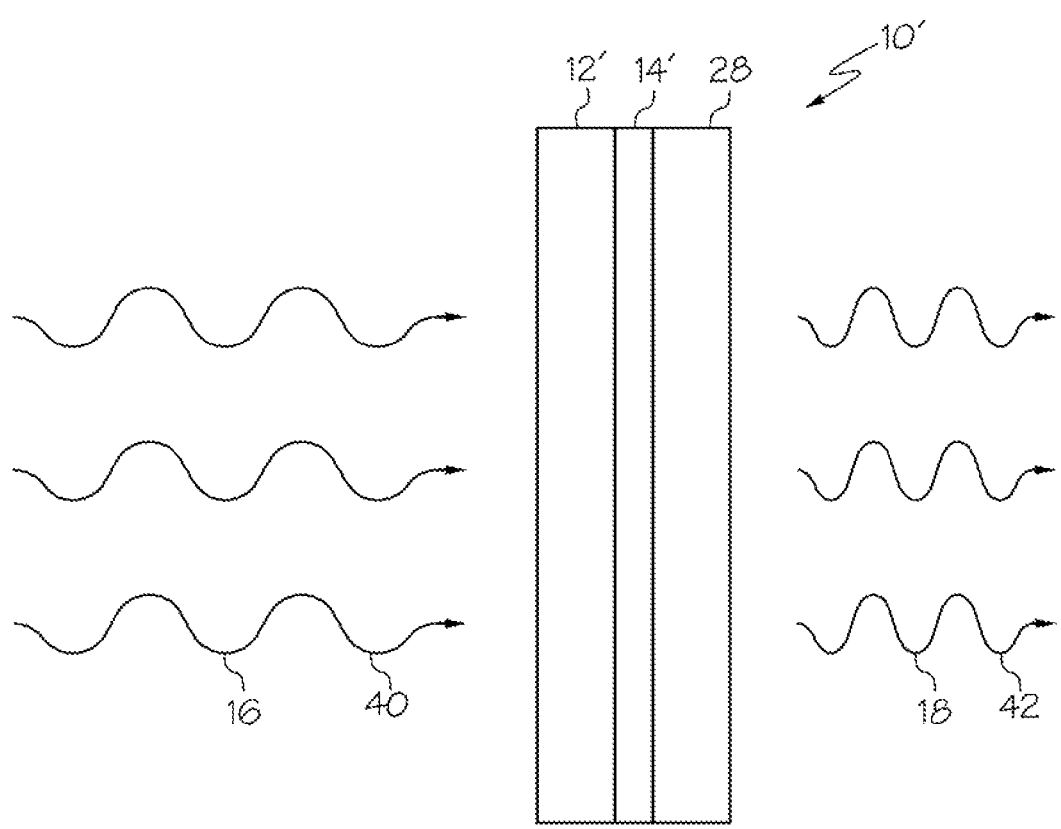
FIG. 4 is a cross-sectional view another embodiment of the electromagnetic radiation shielding assembly.

Referring to FIG. 4, another embodiment of the disclosed shielding assembly, generally designated 10', may include a first substrate layer 12', a second substrate layer 28, and the active layer 14' positioned between the first substrate layer 12' and the second substrate layer 28. For example, the shielding assembly 10' may be a multi-layered laminate. The active layer 14' may be sealed between the first substrate layer 12' and the second substrate layer 28 to provide additional protection to the molecules 26 (FIG. 2) from the atmosphere. It can be appreciated that any number of substrate layers and active layers may be combined to form the shielding assembly 10.

Figure 5:
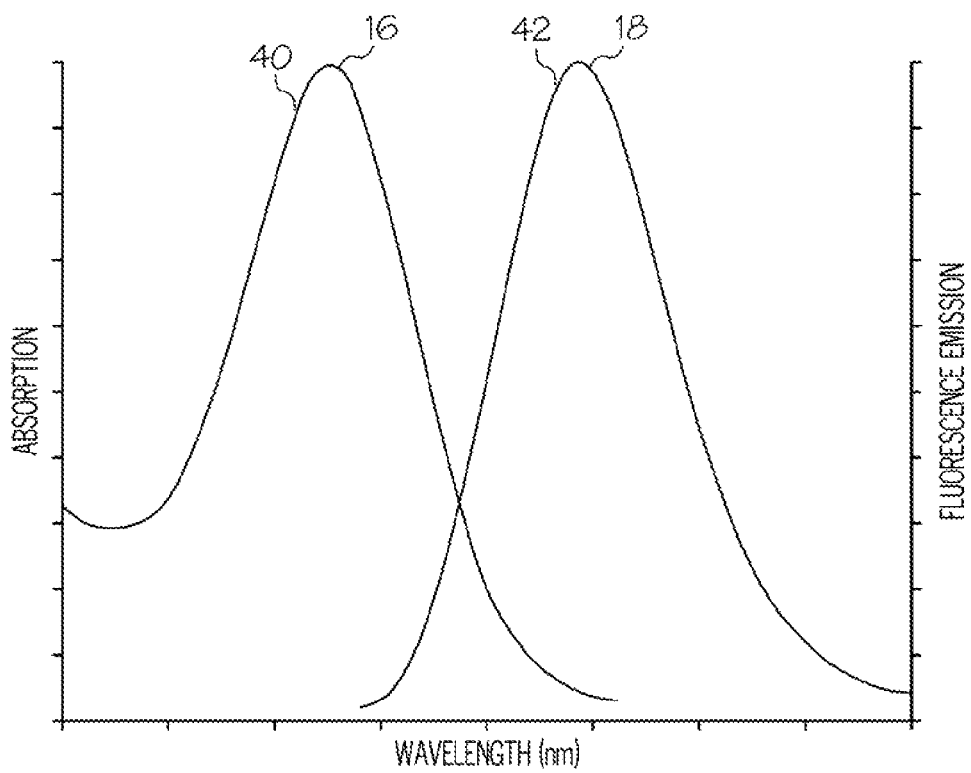
FIG. 5 is a diagram of fluorescent excitation and emission spectra of an embodiment of the fluorescent molecules.

FIG. 5 shows an example of a fluorescent absorption (excitation) and emission spectra of the fluorescent molecules 24 of the active layer 14. As illustrated, the molecules 24 may absorb light (e.g., absorbed light) having a range of wavelengths (e.g., the first wavelength 40) and may emit light (e.g., emitted light) having a range of wavelengths (e.g., the second wavelength 42) longer than the wavelengths of the absorbed light. This transition may be considered an up-conversion since the wavelength of the absorbed light (e.g., absorbed electromagnetic radiation 16) is increased as it passes through the shielding assembly 10 and is emitted as emitted light (e.g., emitted electromagnetic radiation 18).

For example, the active layer 14 may absorb visible light having wavelengths ranging from about 380 nm to about 750 nm and emit non-visible light having a wavelength longer than about 750 nm (e.g., infrared light).

Figure 6:
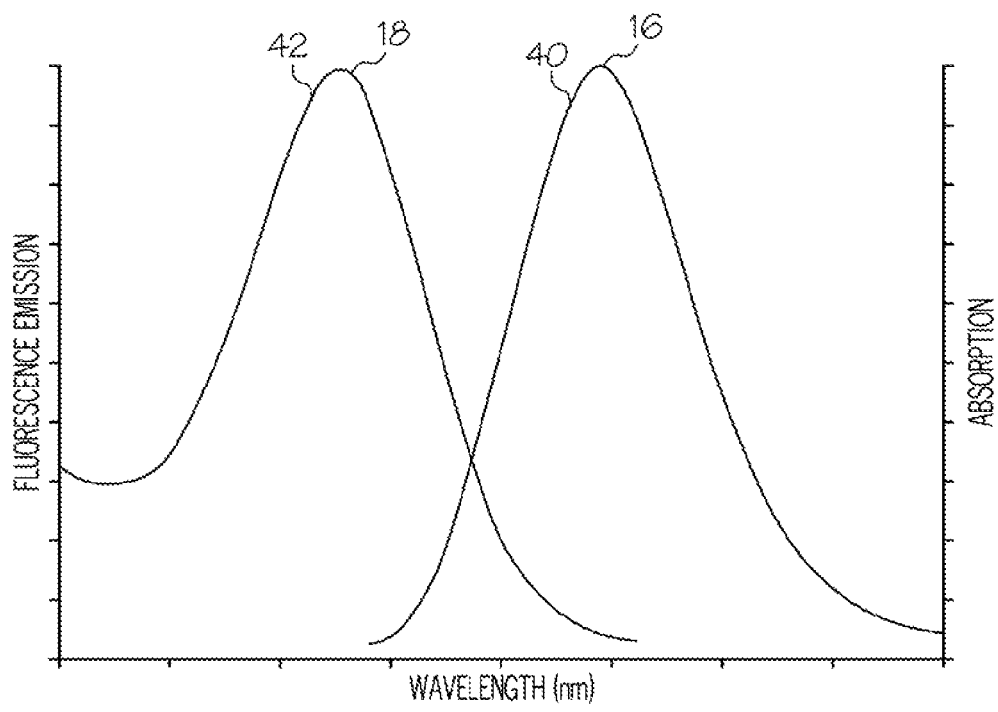
FIG. 6 is a diagram of fluorescent excitation and emission spectra of another embodiment of the fluorescent molecules.

FIG. 6 shows another example of a fluorescent absorption (excitation) and emission spectra of the fluorescent molecules 24 of the active layer 14. As illustrated, the molecules 24 may absorb light (e.g., absorbed light) having a range of wavelengths (e.g., the first wavelength 40) and may emit light (e.g., emitted light) having a range of wavelengths (e.g., the second wavelength 42) shorter than the wavelengths of the absorbed light. This transition may be considered a down-conversion since the wavelength of the absorbed light (e.g., absorbed electromagnetic radiation 16) is decreased as it passes through the shielding assembly 10 and is emitted as emitted light (e.g., emitted electromagnetic radiation 18).

For example, the active layer 14 may absorb visible light having wavelengths ranging from about 380 nanometers (nm) to about 750 nm and emit non-visible light having a wavelength shorter than about 380 nm (e.g., ultraviolet light).

As such, the disclosed shielding assembly 10 may transform light energy that may interfere with visibility into light energy that does not interfere with visibility.

More specifically, the active layer 14 may be a laser adaptive fluorescent material including specially designed fluorescent molecules 24 that react to visible light having the wavelengths corresponding to frequencies of commercially available laser pointers. When the fluorescent molecules 24 react to the laser-beam light, the molecules absorb light from the laser beam and emit light that does not interfere with vision.

In one example implementation, the shielding assembly 10 may be a cockpit window of an airplane and the active layer 14 may absorb laser beam light (e.g., absorbed electromagnetic radiation 16 having a first wavelength 40) directed at the cockpit window and emit non-visible light (e.g., emitted electromagnetic radiation 18 having a first wavelength 42) in order to allow a pilot to perform any necessary function without visual interference.

For example, the active layer 14 may be configured to respond to a green laser pointer by absorbing visible light having a wavelength between about 495 and about 570 nm (e.g., green light) and emitting barely visible or non-visible light having a wavelength longer than about 750 nm (e.g., infrared light).

As another example, the active layer 14 may be configured to respond to a green laser pointer by absorbing visible light having a wavelength between about 495 nm and about 570 nm and emitting barely visible or non-visible light having a wavelength shorter than about 380 nm (e.g., ultraviolet light).

As yet another example, the active layer 14 may be configured to respond to a red laser pointer by absorbing visible light having a wavelength between about 620 nm and about 750 nm (e.g., green light) and emitting barely visible or non-visible light having a wavelength longer than about 750 nm.

Figure 7:
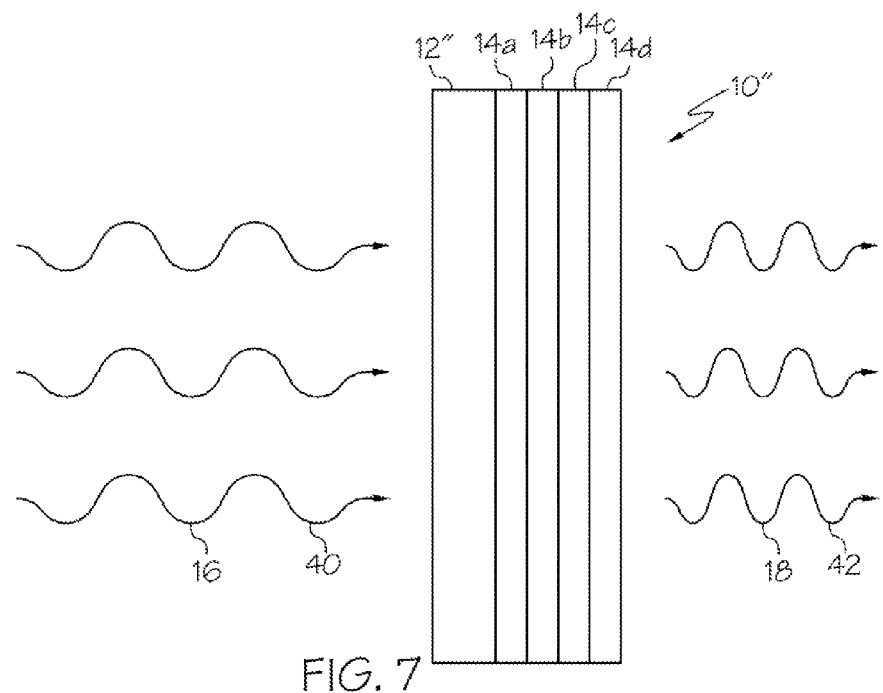
FIG. 7 is a cross-sectional view of another embodiment of the disclosed electromagnetic radiation shielding assembly.

Referring to FIG. 7, another embodiment of the disclosed shielding assembly, generally designated 10", may include at least one substrate layer 12" and a plurality of active layers (identified individually as 14*a*, 14*b*, 14*c*, 14*d*). The plurality of active layers 14*a*, 14*b*, 14*c*, 14*d* may be configured to absorb visible light (e.g., absorbed electromagnetic radiation 16 having a first wavelength 40) and progressively shift the wavelength to non-visible light (e.g., emitted electromagnetic radiation 18 having a first wavelength 42).

Figure 8:
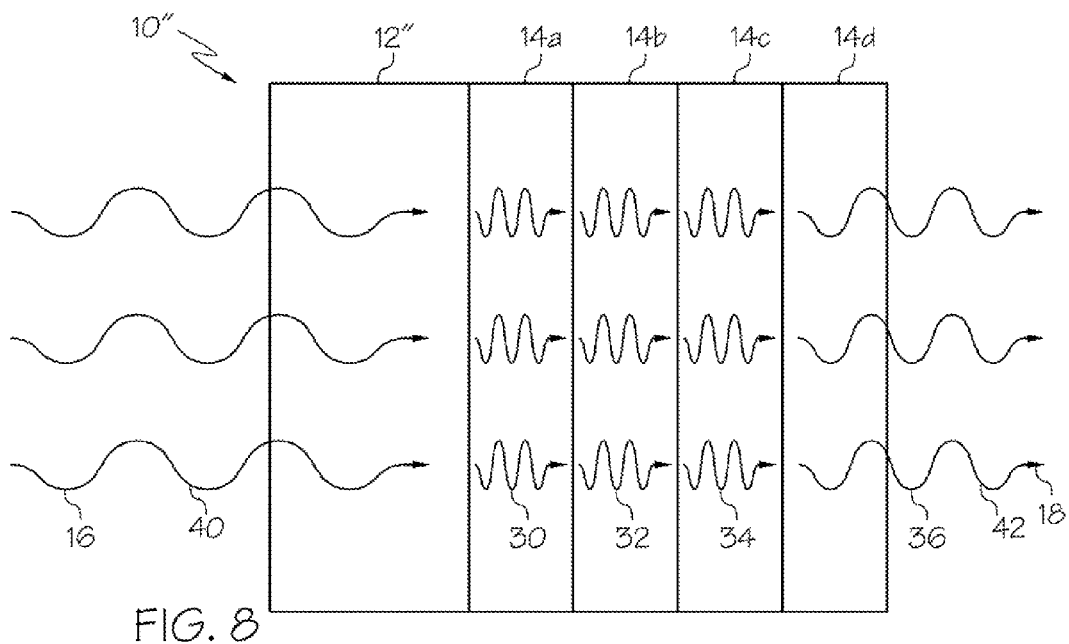
FIG. 8 is a schematic view of the disclosed electromagnetic radiation shielding assembly of FIG. 7.

As shown in FIG. 8, the shielding assembly 10" may be a multi-layered laminate including the substrate layer 12", a first active layer 14*a*, a second active layer 14*b*, a third active layer 14*c*, and a fourth active layer 14*d*. Each of the active layers 14*a*, 14*b*, 14*c*, 14*d* may shift the wavelength (e.g., the first wavelength 40) of visible light (e.g., absorbed electromagnetic radiation 16) toward the non-visible spectrum. For example, incoming visible light having a wavelength in the visible spectrum may undergo a first wavelength shift and may be emitted as light having a first shifted wavelength 30 as it passes through and is absorbed by the first active layer 14*a*. The light having the first shifted wavelength 30 may undergo a second wavelength shift and may be emitted as light having a second shifted wavelength 32 as it passes through and is absorbed by the second active layer 14*b*. The light having the second shifted wavelength 32 may undergo a third wavelength shift and may be emitted as light having a third shifted wavelength 34 as it passes through and is absorbed by the third active layer 14*c*. The light having the third shifted wavelength 34 may undergo a fourth wavelength shift and may be emitted as non-visible light (e.g., emitted electromagnetic radiation 18) having a fourth shifted wavelength 36 (e.g., the second wavelength 42) as it passes through and is absorbed by the third fourth layer 14*d*.

As discussed above, each of the active layers 14*a*, 14*b*, 14*c*, 14*d* may include fluorescent molecules 24 (FIG. 2) being configured, or tuned, to react to or be excited by light having a predetermined wavelength or range of wavelengths. For example, the first active layer 14*a* may be configured to absorb visible light having a wavelength ranging from about 495 nm to about 570 nm (e.g., green light) and emit light having the first shifted wavelength 30 ranging from about 570 nm to about 590 nm (e.g., yellow light). The second active layer 14*b* may be configured to absorb light having the first shifted wavelength 30 ranging from about 570 nm to about 590 nm and emit light having the second shifted wavelength 32 ranging from about 590 nm to about 620 nm (e.g., orange light). The third active layer 14*c* may be configured to absorb light having the second shifted 32 wavelength ranging from about 590 nm to about 620 nm and emit light having the third shifted wavelength 34 ranging from about 620 nm to about 750 nm (e.g., red light). The fourth active layer 14*c* may be configured to absorb light having the third shifted wavelength 36 ranging from about 620 nm to about 750 nm and emit non-visible light having the fourth shifted wavelength 36 longer than about 750 nm (infrared light).

It can be appreciated that each of the plurality of wavelength shifts can be of the up-conversion type (FIG. 4) to increase the wavelength of the light toward the infrared spectrum or the down-conversion type (FIG. 5) to decrease the wavelength of the light toward the ultraviolet spectrum. Thus, the number of active layers 14 may depend upon the shift direction and total magnitude of the shift in wavelength (the number of shifts in wavelength) to transform visible light to non-visible light.

The shielding assembly 10" may form a part of or the entirety of a vehicle windshield, a cockpit window, a building window, a heads-up display, a lens or the like. The disclosed shielding assembly 10" may be particularly beneficial when used in an aerospace application. It is contemplated that the disclosed shielding assembly 10" may be utilized as any substantially transparent surface configured to reduce or eliminate visual obstructions induced by glare on any optics, such as a human eye, visual imaging, optical sensors, and the like. It can be appreciated that variations of the shielding assembly 10" may be equally useful in non-aerospace applications, such as automotive, law enforcement, air traffic control, military, and/or building industries. The active layers 14*a*, 14*b*, 14*c*, 14*d* may be applied to the substrate layer 12" during manufacturing or supplied for retrofitting on an existing substrate layer 12".

In an example implementation, the shielding assembly 10" may include at least one substrate layer 12" and at least one active layer 14*a* to form a rigid, transparent panel forming a cockpit window, a heads-up display, a helmet visor, or eyeglass lenses.

In another example implementation, the shielding assembly may include at least one active layer 14*a* to form a flexible, transparent sheet applied to an inner surface of a cockpit window, a heads-up display, a helmet visor, or eyeglass lenses.

In yet another example implementation, the shielding assembly 10" may be a rigid, transparent panel positioned between the pilot and the cockpit window or heads-up display through which light (e.g., laser beams light) can enter the cockpit.

It can be appreciated that the shielding assembly 10" may not block visible light that the pilot uses to see, as is done by sunglasses and window tinting. Further, because the molecule 24 may always be reacting to incoming light within a particular wavelength, there may be no time lag between the light hitting the shielding assembly 10" and the molecules 24 (FIG. 3) of the active layers 14*a*, 14*b*, 14*c*, 14*d* reacting to the light.

Additionally, the florescent molecules 24 (FIG. 3) do not require a power source to operate. As such, the shielding assembly 10" may overcome drawbacks associated with light re-active eyeglasses or electrically dimming glass.

Figure 9:
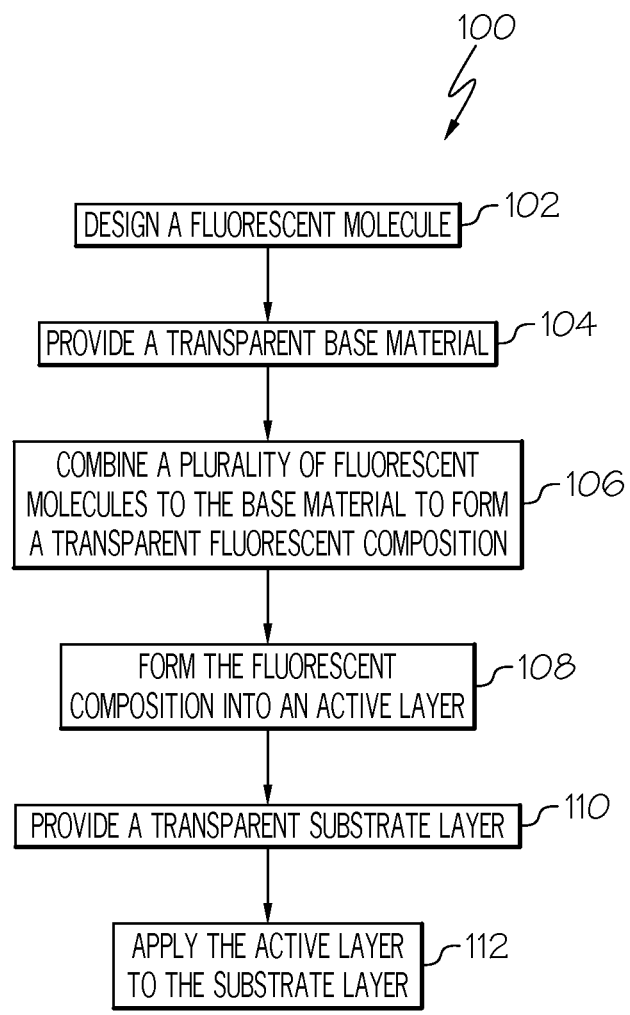
FIG. 9 is a flow chart illustrating an embodiment of the disclosed method for making an electromagnetic shielding assembly configured to absorb light having a first wavelength and to emit light having a second wavelength.

Referring to FIG. 9, also disclosed is a method, generally designated 100, for making a shielding assembly configured to absorb light having a first wavelength and to emit light having a second wavelength. As shown at block 102, a fluorescent molecule may be selected (e.g., designed) having particular excitation and emission characteristics in response to electromagnetic radiation having a specific wavelength or range of wavelengths.

As shown at block 104, a base material, or carrier, may be provided to receive a plurality of fluorescent molecules.

As shown at block 106, a plurality of fluorescent molecules may be combined with the base material to form a fluorescent composition material.

As shown at block 108, the fluorescent composition material may be formed into an active layer. The active layer may be a transparent solid or a transparent liquid.

As shown at block 110, a transparent substrate layer may be provided.

As shown at block 112, the active layer may be applied to the substrate layer. For example, a transparent, solid active layer may be positioned adjacent to the substrate layer. As another example, a transparent, liquid active layer may be applied to the substrate layer as a coating or film.

Accordingly, the disclosed shielding assembly may automatically redirect electromagnetic radiation from a radiation source (e.g., a laser beam) by absorbing visible light and emitting non-visible light without interference and preventing damage to eyesight. Thus, the shielding assembly may eliminate the need for protective eyewear, which can limit the vision capabilities of the wearer. For example, when used as a cockpit window or heads up display of an airplane, the disclosed shielding assembly may reduce or eliminate the effect of laser induced glare on the cockpit window caused by laser beam light and protect the eyes of the flight crew during critical phases of flight, such as takeoff and landing, search and rescue operations, homeland security video surveillance, combat operations, and the like.

Although various embodiments of the disclosed shielding assembly have been shown and described, modifications may occur to those skilled in the art upon reading the specification. The present application includes such modifications and is limited only by the scope of the claims.

What is claimed is:

1. A shielding assembly comprising:
   a substantially transparent substrate layer; and
   a plurality of active layers positioned with respect to said substrate;
   wherein said plurality of active layers is configured to
      absorb electromagnetic radiation in a visible portion of an electromagnetic spectrum;
      successively shift, through each one of said plurality of active layers, said electromagnetic radiation from said visible portion of said electromagnetic spectrum to a non-visible portion of said electromagnetic spectrum; and
      emit said electromagnetic radiation in said non-visible portion of said electromagnetic spectrum.

2. The assembly of claim 1 wherein at least one of said plurality of active layers comprises a transparent film applied to at least one major surface of said substrate layer.

3. The assembly of claim 1 wherein at least one of said plurality of active layers comprises a rigid transparent panel positioned adjacent to at least one major surface of said substrate layer.

4. The assembly of claim 1 wherein each one of said plurality of active layers comprises fluorescent molecules tuned to absorb said electromagnetic radiation having an absorbed wavelength and emit said electromagnetic radiation having an emitted wavelength, wherein said absorbed wavelength and said emitted wavelength for said fluorescent molecules of each one of said plurality of active layers is different, and wherein said emitted wavelength for said fluorescent molecules of each one of said plurality of active layers is different.

5. The assembly of claim 4 wherein said fluorescent molecules are dispersed in a base material.

6. The assembly of claim 4 wherein said fluorescent molecules comprise a molecular dye.

7. The assembly of claim 4 wherein said emitted wavelength for each one of said plurality of active layers is longer than said absorbed wavelength for a same one of said plurality of active layers.

8. The assembly of claim 4 wherein said fluorescent molecules comprise a styryl dye.

9. The assembly of claim 4 wherein said emitted wavelength for each one of said plurality of active layers is shorter than said absorbed wavelength for a same one of said plurality of active layers.

10. The assembly of claim 1 wherein said plurality of active layers effectuates an overall shift in a wavelength of said electromagnetic radiation travelling through said shielding assembly greater than a capacity to shift said wavelength by any one of said plurality of active layers.

11. The assembly of claim 1 wherein each one of said plurality of active layers effectuates a stepwise shift from an absorbed wavelength to an emitted wavelength of said electromagnetic radiation travelling through said shielding assembly to effectuate an overall shift from said visible portion of said electromagnetic spectrum to said non-visible portion of said electromagnetic spectrum.

12. The assembly of claim 1 wherein each one of said plurality of active layers are configured to uniquely transform said electromagnetic radiation from an absorbed wavelength to an emitted wavelength, wherein said absorbed wavelength and said emitted wavelength for each one of said plurality of active layers is different, and wherein said emitted wavelength for each one of said plurality of active layers is different.

13. A shielding assembly comprising:
    a first active layer configured to absorb electromagnetic radiation having a first wavelength and emit electromagnetic radiation having a second wavelength, said second wavelength being different than said first wavelength; and
    a second active layer positioned relative to said first active layer, said second active layer configured to absorb said electromagnetic radiation having said second wavelength and emit said electromagnetic radiation having a third wavelength, said third wavelength being different than said second wavelength.

14. The assembly of claim 13 wherein said first wavelength is in a visible electromagnetic spectrum and said third wavelength is in a non-visible electromagnetic spectrum.

15. The assembly of claim 13 wherein at least one of said first active layer and said second active layer comprises:
    a transparent base material; and
    fluorescent molecules dispersed in said base material.

16. The assembly of claim 15 wherein said fluorescent molecules comprise a molecular dye.

17. The assembly of claim 13 wherein said first wavelength is in a visible electromagnetic spectrum, said third wavelength is in a non-visible electromagnetic spectrum, and said second wavelength is between said visible electromagnetic spectrum and said non-visible electromagnetic spectrum.

18. The assembly of claim 13 further comprising a substrate layer, wherein at least one of said first active layer and said second active layer is coupled to said substrate layer.

19. The assembly of claim 13 wherein at least one of said first active layer and said second active layer comprises a solid panel.

20. The assembly of claim 13 further comprising:
a third active layer positioned relative to said second active layer, said third active layer configured to absorb said electromagnetic radiation having said third wavelength and emit said electromagnetic radiation having a fourth wavelength, said fourth wavelength being different than said third wavelength,
wherein said first wavelength is in a visible electromagnetic spectrum and said fourth wavelength is in a non-visible electromagnetic spectrum.

* * * * *